United States Patent [19]

Ichinose

[11] Patent Number: 4,831,590

[45] Date of Patent: May 16, 1989

[54] SEMICONDUCTOR MEMORY INCLUDING AN OUTPUT LATCH HAVING HYSTERESIS CHARACTERISTICS

[75] Inventor: Katsuki Ichinose, Hyogo, Japan

[73] Assignee: Mitsubishi Denki Kabushiki Kaisha, Tokyo, Japan

[21] Appl. No.: 4,584

[22] Filed: Jan. 20, 1987

[30] Foreign Application Priority Data

Jan. 17, 1986 [JP] Japan .................................. 61-8304

[51] Int. Cl.$^4$ .............................................. G11C 7/00
[52] U.S. Cl. .............................. 365/189.05; 365/203; 365/205; 307/290
[58] Field of Search ............... 365/189, 203, 205, 207, 365/208, 230, 154, 156; 307/290

[56] References Cited

U.S. PATENT DOCUMENTS

| 4,115,748 | 9/1978 | Kubo et al. ......................... 307/290 |
| 4,456,841 | 2/1982 | Lam et al. .......................... 365/208 |
| 4,532,439 | 7/1985 | Koike ................................. 365/156 |
| 4,583,203 | 4/1986 | Monk .................................. 365/189 |
| 4,616,148 | 10/1986 | Ochii et al. ......................... 365/208 |
| 4,653,027 | 3/1987 | Baba et al. .......................... 365/205 |
| 4,656,610 | 4/1987 | Yoshida et al. ...................... 365/189 |
| 4,706,218 | 11/1987 | Sodd .................................. 365/189 |

FOREIGN PATENT DOCUMENTS 0006620 1/1983 Japan ................................. 307/290
59-131221 7/1984 Japan .

OTHER PUBLICATIONS

U. Tietze et al, "Halbleiter-Schaltungstechnik", Springer-Verlag Berlin, 1976, pp. 476-506.
"A Fault-Tolerant 30 ns/375 mW 16K x 1 NMOS Static RAM", Kim C. Hardee et al, Journal of Solid-State Circuits, vol. SC-16, No.5, Oct. 1981, pp. 435-443.

Primary Examiner—Stuart N. Hecker
Assistant Examiner—Glenn A. Gossage
Attorney, Agent, or Firm—Lowe, Price, LeBlanc, Becker & Shur

[57] ABSTRACT

A semiconductor memory device in which an output data bus (14) is precharged at a middle potential level prior to reading out data. A Schmidt Trigger circuit (39) having a hysteresis loop in input-output characteristics is provided between the output data bus (14) and a data output buffer (15). This allows the data output buffer (15) to maintain a stable output (16) while precharging the data bus (14).

6 Claims, 5 Drawing Sheets a) ADDRESS 60 b) MIDDLE LEVEL CONTROL SIGNAL c) SIGNAL ON OUTPUT DATA BUS d) SIGNAL AT OUTPUT TERMINAL

SEMICONDUCTOR MEMORY INCLUDING AN OUTPUT LATCH HAVING HYSTERESIS CHARACTERISTICS

BACKGROUND OF THE INVENTION

1. Field of the Invention

The present invention relates to a semiconductor memory device in which a desired output signal line is held at a middle potential level by using an internal synchronous signal generated in response to change in an address signal externally applied so that fast operation is ensured.

2. Description of the Prior Art

Various kinds of semiconductor memory devices such as a dynamic type and a static type have been known. As an example of conventional semiconductor memory devices, a static RAM (Random Access Memory) is now described.

FIG. 1 is a block diagram showing an example of a structure of a conventional static RAM. Referring now to FIG. 1, a structure of the conventional static RAM is described.

Memory cells for storing information are divided into a plurality of the blocks 100a to 100c. Each memory block 100a, 100b, 100c has an identical structure and comprises a memory cell array 1 having memory cells arranged in an array, a group of pairs of bit lines 4 connected to memory cells aligned in a column direction out of memory cells included in the memory cell array 1, a group of transfer gates 7 each provided for each of the groups of pairs of bit lines 4 for transferring signals on the corresponding pairs of bit lines 4, and a sense amplifier 9 for detecting, amplifying and outputting signals applied through a transfer gate selected from the group of transfer gates 7 by a column address decoded signal 6 applied through a Y decoder 5 which decodes a column address signal externally applied. An internal synchronous circuit 19 is responsive to change in an external address signal 60 for generating an internal synchronous signal 18 and applying it to a switch select signal generator 12 as well as for generating a middle level control signal 20 and applying it to a middle level supply 21. The switch select signal generator 12 is activated in response to the internal synchronous signal 18 from the internal synchronous circuit 19 for generating a switch select signal 13 in response to a column address signal 17 and applying it to each switch circuit 11a, 11b, 11c. The switch circuits 11a to 11c are connected, respectively, through a sense amplifier output signal line 10 to the sense amplifier 9 included in each of memory cell array blocks 100a to 100c and are responsive to the switch select signal 13 from the switch select signal generator 12 for transferring an output of the corresponding sense amplifier to an output data bus 14. The middle level supply 21 is responsive to the middle level control signal 20 from the internal synchronous circuit 19 for holding the level on the output data bus 14 at a middle potential level between "H" and "L" levels. An output buffer 15 is connected to the output data bus 14 for waveform-shaping a signal on the output data bus 14 and applying it to an output terminal 16.

The operation is now described. In response to a row address signal (not shown) externally applied, a word line (not shown) is designated by the row address signal to become an active state "H", so that a single row 2 of memory cells is selected. As a result, data stored in the memory cells 3 in the selected row 2 are read out on the group of pairs of bit lines 4. At the same time, the column address decoded signal 6 is applied to the group of transfer gates 7 from the Y decoder 5 for decoding a column address signal. The group of transfer gates 7 comprises transfer gates each connected to each corresponding pair of bit lines of the group of pairs of bit lines 4, and corresponding transfer gate is rendered conductive by the column address decoded signal 6 from the Y decoder 5. As a result, data on a particular pair of bit lines out of the group of pairs of bit lines 4 is selected, and is transferred to an I/O line 8. Data on the I/O line 8 is provided to the sense amplifier 9, so that the data is amplified and is applied through the sense amplifier output signal line 10 to the switch circuit 11a. Although the operation so far described is directed to the particular memory cell array block 100a, it should be noted that the same operation is performed in the other blocks 100b and 100c. The switch circuits 11a to 11c are responsive to the switch select signals 13 applied from the switch select signal generator 12. The switch select signal generator 12 is activated by the internal synchronous signal 18 from the internal synchronous circuit 19, generates the switch select signal 13 for selecting only one of the plurality of switch circuits 11a to 11c in response to the column address signal 17, and apply it to one of the switch circuits 11a to 11c. Thus, the corresponding sense amplifier output signal line 10 is electrically connected to the output data bus 14 through a selected switch circuit. As a result, data on the sense amplifier output signal line 10 is transferred to the output data bus 14 through the selected switch circuit in a conductive state. The data is waveform-shaped in the output buffer 15 and then is transferred to the output terminal 16.

As shown in FIG. 1, a memory cell array is divided into a plurality of memory blocks 100a to 100c. Furthermore, each of the memory blocks 100a to 100c comprises the sense amplifier 9 for the reasons described in the following. More particularly, the number of memory cells included therein increases as memory capacity of the semiconductor memory device increases. Thus, the number of the pairs of bit lines 4 for which the sense amplifier 9 should have responsibility is also increased. However, if and when only one sense amplifier 9 is provided, the I/O line 8 connected thereto increases in length, parasitic capacitance depending on the interconnection length increases, and the RC delay (R: interconnection resistance, C: interconnection capacitance) of a signal increases, causing deterioration of performance so that the access time increases. In order to avoid such deterioration of performance, the number of the pairs of bit lines 4 for which a single sense amplifier 9 should be responsible is decreased by dividing a memory cell array so that the I/O line 8 may not increase in length.

With a memory cell array divided into a plurality of blocks, one of output data on the sense amplifier output signal lines 10 connected to the memory blocks 100a to 100c, respectively, as described above is selected by one of the switch circuits 11a to 11c and is transferred to the output data bus 14. However, since the output data bus 14 must be connected to all the sense amplifiers 9, parasitic capacitance depending on the interconnection length increases and thus the access time increases. In order to prevent increase of the access time due to the interconnection length of the output data bus 14, there is a method of applying forcedly to the output data bus 14 the middle potential level between "H" and "L" levels immediately before sense amplifier output data is read out to the output data bus 14, by using the middle level control signal 20 generated by the internal synchronous circuit 19 (referred to as "a method of making an output data bus a middle potential level" hereinafter).

FIG. 2 is a diagram showing timing of signals on each signal line in the semiconductor memory device for making an output data bus a middle potential level. Referring now to FIGS. 1 and 2, the operation is described. When the address signal 60 (waveform (a) in FIG. 2) changes, an output of the sense amplifier 9 (waveform (b) in FIG. 2) changes from an "H" level to an "L" level or from an "H" level to an "L" level in response to the read-out data. When the output of the sense amplifier 9 (waveform (b) in FIG. 2) changes, correspondingly the signal level on the output data bus 14 changes. When the output data bus 14 is not made a middle potential level, a change in the signal level becomes slower than that of the output of the sense amplifier 9 as shown in waveform (c) in FIG. 2, because the output data bus 14 has large parasitic capacitance depending on the interconnection length. As compared with a time point 26 where of the output of the sense amplifier 9 (waveform (b) in FIG. 2) changing from an "H" level to an "L" level and a waveform of the output of the sense amplifier 9 changing from an "L" level to an "H" level are crossing (referred to simply as a cross time point of waveforms hereinafter), a cross time point 27 of waveforms at the level of the output bus 14 (waveform (c) in FIG. 2) is slightly delayed. In order to prevent such delay, if the output data bus 14 is forced to a middle potential level by using a middle potential supply 21 controlled by the middle potential control signal 20 (waveform (d) in FIG. 2) immediately before the cross time point 26 of the outputs of the sense amplifier 9, the signal waveform on the output data bus 14 is formed as shown in waveform (b) in FIG. 2, so that the delay of a cross time point 29 of the signal waveforms on the output data bus 14 from the cross time point 26 of the outputs of the sense amplifier 9 can be extremely decreased. Hence, $V_M$ shown in waveform (e) in FIG. 2 represents a middle potential level. As a result, the signal waveform provided to the output terminal 16 through the output buffer 15 is formed as shown in waveform (h) in FIG. 2, so that the access time T2 can be shorter than the access time T1 when the output data bus 14 is not made a middle potential level (waveform (g) in FIG. 2). In the above description, the signal waveforms of the internal synchronous signal 18 (waveform (f) in FIG. 2) and the middle level control signal 20 (waveform (d) in FIG. 2) are shown only by way of an example, and the middle potential level is provided to the output data bus 14 during a period T.

A conventional semiconductor memory device is constructed as described above. However, an input stage of the output buffer 15 generally comprises, for example, an inverter, a combinational circuit including an NAND gate, an NOR gate or the like, or a latch circuit. Any circuit has an input logical threshold (an input level required for changing an output level. For Example, if the signal level on the output data bus 14 is at a higher potential level than the input logical threshold, an "L" level is outputted to the next stage, and if the signal level on the output data bus 14 is data lower potential level than the input logical threshold, an "H" level is outputted to the next stage.

In the structure of the conventional semiconductor memory device, it is extremely difficult to control the middle potential level ($V_M$ in waveform (e) in FIG. 2) to be applied to the sense amplifier output data bus 14 at the same potential level as the input logical threshold in the input stage of the output buffer 15 because of noise, variation of device characteristics or the like. Therefore, in the conventional semiconductor memory device, the level on the output data bus 14 at the time point (29 in waveform (e) in FIG. 2), when the output data bus 14 becomes the middle potential level $V_M$, is somewhat higher or lower than the input logical threshold in the input stage of the output buffer 15. As an example, assuming that the middle potential level $V_M$ on the output data bus 14 is somewhat higher than the input logical threshold in the input stage of the output buffer 15, the input stage of the output buffer 15 always outputs an "L" level to the following stage, during the period T when the output data bus 14 is at the middle potential $V_M$, and thus the output terminal 16 outputs an "L" (or an "H") level during the period T. As a result, as shown in waveforms (i), and (k) in FIG. 2, output noise is caused. More specifically, FIG. 2(i) shows a signal waveform at the terminal 16 when read-out data changes from an "H" to an "L" level with an address signal, waveform (j) in FIG. 2 shows a signal waveform at the output terminal 16 when read-out data changes from an "L" level to an "H" level, and waveform (k) in FIG. 2 shows a signal waveform at the output terminal 16 when read-out data continues from an "H" level to an "H" level. In waveform (j) in FIG. 2 data in the previous cycle is at an "L" level. Therefore, even if an "L" level is provided during the period T, it is identical to data in the previous cycle, so that output noise does not apparently exist. As shown in waveforms (i) to (k) in FIG. 2, an "L" level is once outputted immediately before,..true data is outputted in any case. In waveforms (i) to (k) in FIG. 2, the level at the output terminal 16 is an "L" level during the period T. However, it is the same with the case where the signal level at the output terminal 16 is an "H" level during the period T. As a result, difference in the access time between reading out of data at an "H" level and read-out of data at an "L" level is caused, and increase of the access time is caused due to change in state and increase of the consumed current is caused by flow of through-out current due to change in state.

As the prior art related to the present invention, an article by K. C. Hardee et al., entitled "A Fault-Torelant 30 ns/375mW 16k×1 NMOS Static RAM", IEEE Journal of Solid-State Circuits, Vol. SC-16, No. 5, October 1981, pp. 435–443 is provided.

The above prior art describes a method for equilibrating potential of bit lines of each pair of bit lines to reduce the access time. The technique is not limited to the bit line and is applicable to a data bus. However, the prior art does not disclose the technique for holding data in the previous cycle as in the present invention. Therefore, if the conventional equilibration technique is applied to the data bus, the above described problems occurs.

SUMMARY OF THE INVENTION

An object of the present is to eliminate the above described problems and to provide a semiconductor memory device in which for example, when an output data bus is made to be a middle potential level immediately before data is read out, the signal level at an output terminal can be held at the signal level read out in the previous data cycle even during a period T when the middle potential level is provided so that the middle potential level does not bring output noise.

A semiconductor memory device according to the present invention is adapted such that a latch circuit having hysteresis characteristics in input-output characteristics, such as a Schmidt trigger circuit, is inserted between an output signal line to which the middle potential level is supplied and a circuit in which signals on the output signal line are accepted.

The output signal line is an output data bus, for example, and a circuit receiving signals on the output signal line is an output buffer, for example.

A latch circuit having hysteresis characteristics preferably includes a first inverter and a second inverter, the output of the first inverter being applied to the input of the second inverter, the output of the second inverter being applied to the input of the first inverter and the signal output being applied from an output terminal of the first inverter.

A latch circuit having hysteresis input-output characteristics produces a hysteresis input-output loop including a middle potential level therein.

A latch circuit having hysteresis characteristics according to the present invention receives signals of a higher level than the middle potential level to invert the state so as to provide as an output the inverted state and receives signals of a lower level, by a predetermined potential level, than the middle potential level to invert the state and to provide as an output the inverted state. Therefore, when the level on the output signal line is at approximately the middle potential level, the output of the latch circuit holds the state prior to application of the middle potential level.

The case where a Schmidt trigger circuit is used as a latch circuit having hysteresis characteristics, an output signal line is used as an output data bus, and the Schmidt trigger circuit is inserted between the output data bus and an output buffer is specifically described in the following. The Schmidt trigger circuit may have a structure providing the same logical signals as signals of the output data bus or a structure providing the inverted logical signals. As an example, the latter case is described.

An input logical threshold for changing the output of the Schmidt trigger circuit from an "L" level to an "H" level is set to be lower, by a predetermined potential, than the middle potential level of the output data bus. The input logical threshold for changing the output from an "H" level to an "L" level is set to be higher by a predetermined potential than the middle potential level of the output data bus. As a result, while the level on the output data bus is at the middle potential level, the Schmidt trigger circuit is not triggered and the output read out in the previous data cycle is held without changing the output thereof, so that the output terminal holds data read out in the previous data cycle. Thereafter, when the output data bus is released from the middle potential level and the level goes higher or lower than the input logical threshold of the Schmidt trigger circuit, the Schmidt trigger circuit is triggered and the output thereof changes. Therefore, output noise can be removed.

These objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
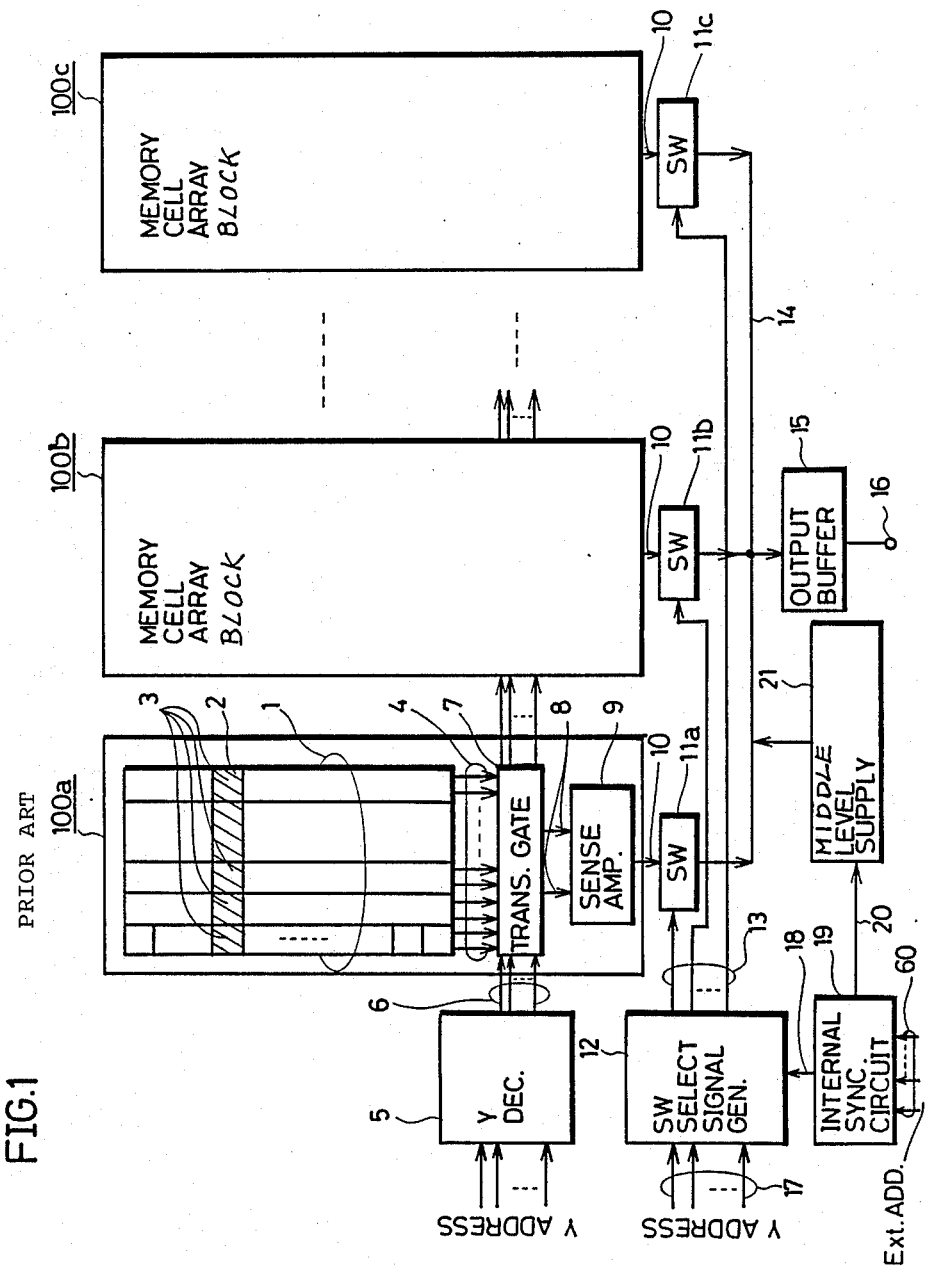
FIG. 1 is a diagram showing a structure of a conventional semiconductor memory device.

Referring now to the drawings, an embodiment of the present invention is described.

Figure 3:
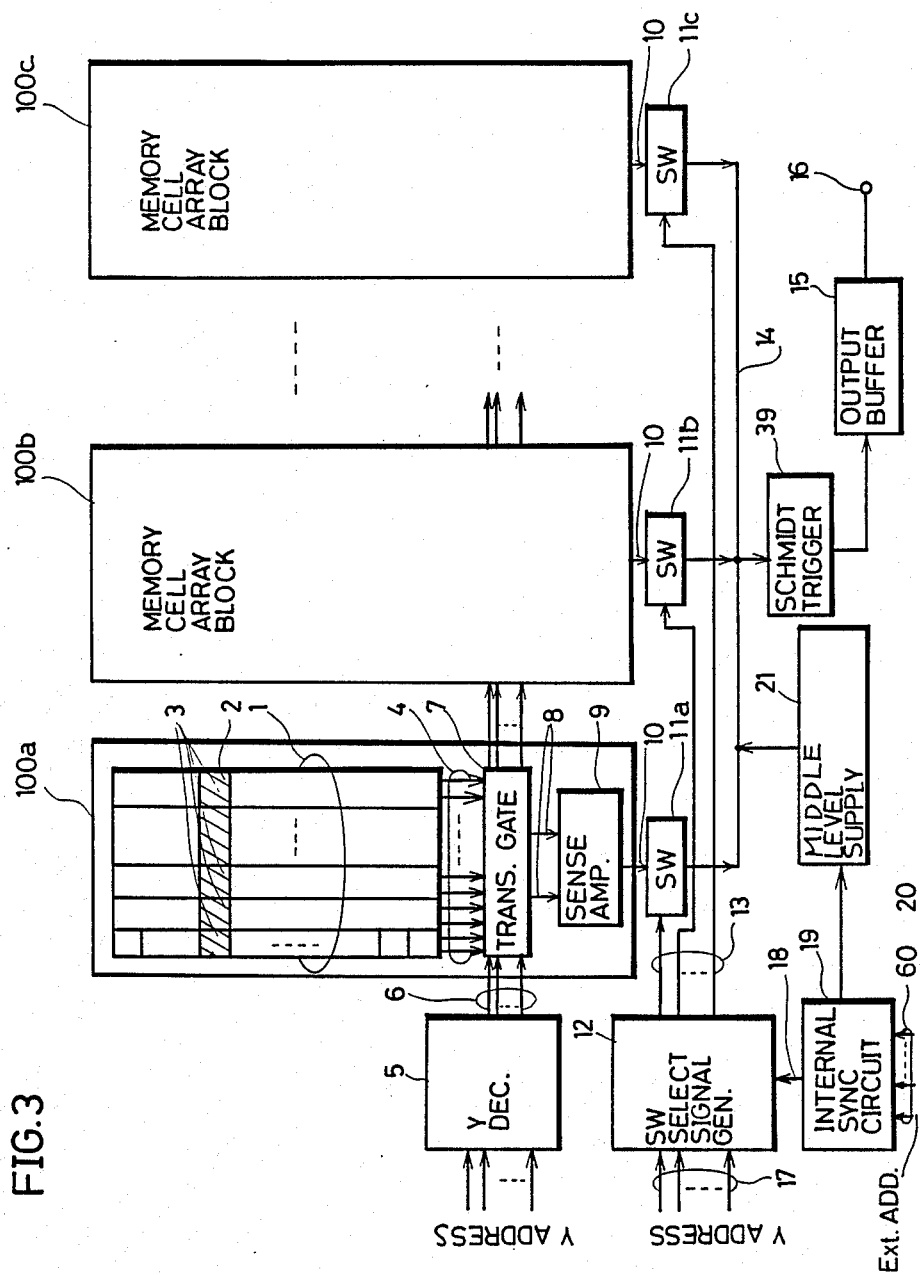
FIG. 3 is a diagram showing a structure of a semiconductor memory device according to an embodiment of the present invention.

FIG. 3 is a diagram showing an example of a structure of a semiconductor memory device according to an embodiment of the present invention. In FIG. 3, a latch circuit having hysteresis characteristics in input-output characteristics, that is, a Schmidt trigger circuit 39 is inserted between an output data bus 14 and an output buffer 15. The remaining structure is identical to the structure of the conventional semiconductor memory device shown in FIG. 1 and the corresponding portions have identical reference numerals.

Figure 4:
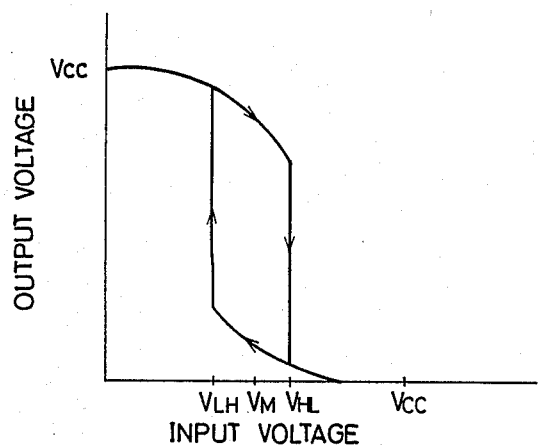
FIG. 4 is a diagram showing input-output voltage characteristics of a Schmidt trigger circuit used in an embodiment of the present invention.

FIG. 4 is a diagram showing an example of input-output voltage characteristics of the Schmidt trigger circuit inserted in accordance with the embodiment. In FIG. 4, $V_{LH}$ shows an input logical threshold of the Schmidt trigger circuit for changing the output from an "L" level to an "H" level, $V_{HL}$ shows an input logical threshold of the Schmidt trigger circuit for changing the output from an "H" level to an "L" level, and $V_M$ shows a middle potential level provided to the output data bus. One input logical threshold $V_{LH}$ is set to be lower, by a certain potential, than the middle potential level $V_M$, and the other input logical threshold $V_{HL}$ is set to be higher, by a certain potential, than the middle potential level $V_M$. As shown in FIG. 4, the Schmidt trigger circuit 39 inverts logical level on the output data bus.

Figure 5:
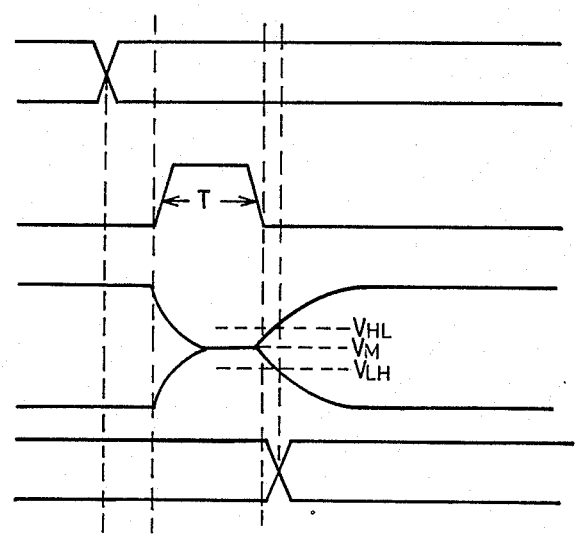
FIG. 5 is a waveform diagram showing the operation of the Schmidt trigger circuit according to the present invention.

FIG. 5 is a waveform diagram of signals for illustrating the operation of the Schmidt trigger circuit inserted in accordance with the present invention. Referring now to FIGS. 3 to 5, the operation of the semiconductor memory device according to an embodiment of the present invention is described.

Figure 2:
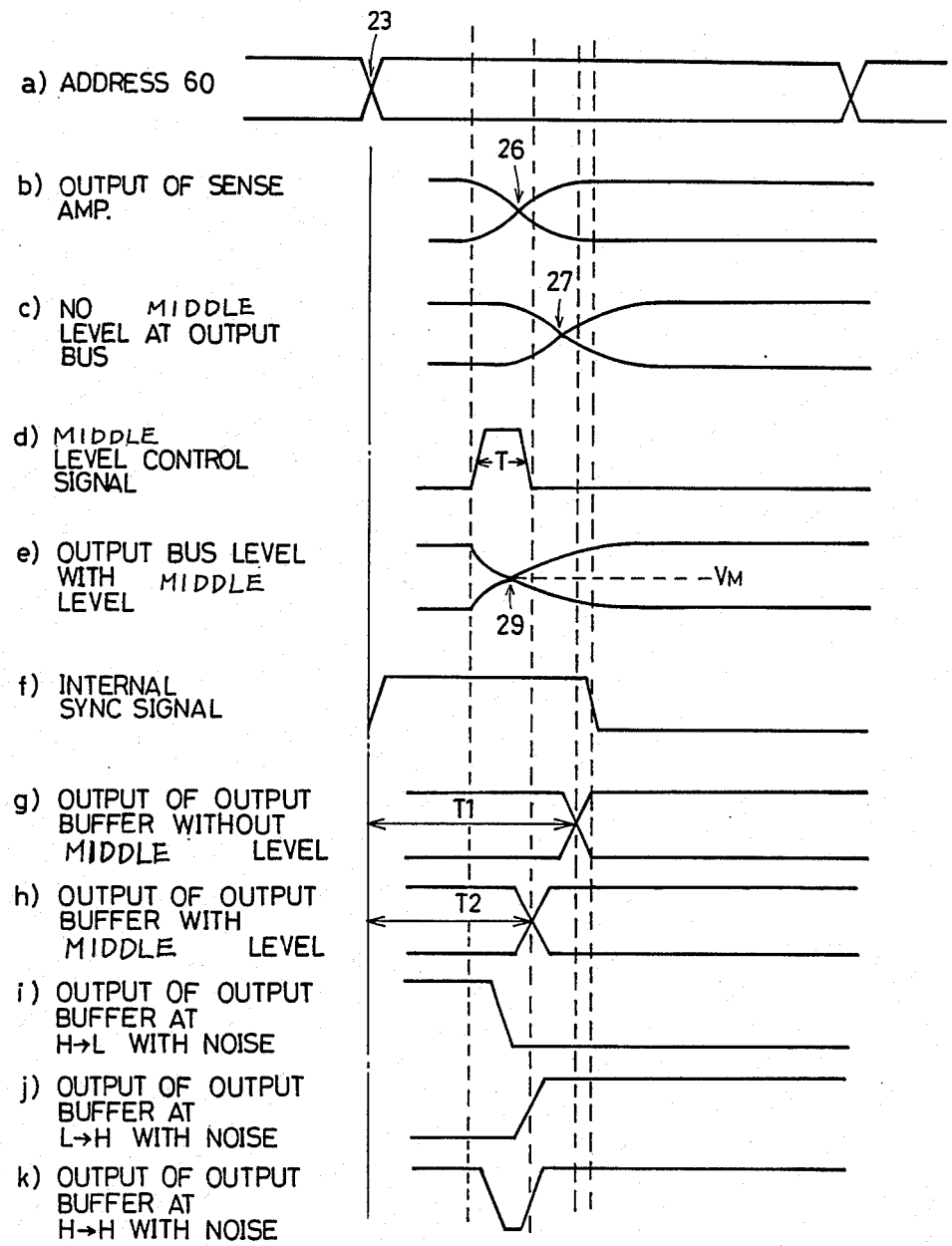
FIG. 2 is a waveform diagram of signals showing operation timing of the conventional semiconductor memory device.

The process during which data of a memory cell is read out to the output data bus 14 and the timing of each control signal are identical to those of the conventional semiconductor memory device (FIGS. 1 and 2). The output data bus 14 is held at the middle potential level $V_M$ during a period T in response to the middle level control signal 20 (waveform (b) in FIG. 5). The level on the output data bus 14 changes from an "H" or "L" level to the middle potential level $V_M$ in accordance with the previous state. However, the output of the Schmidt trigger circuit 39 is held at the previous state during the period T, due to input-output voltage characteristics of the Schmidt trigger circuit 39 shown in FIG. 4. More specifically, even if the level on the output data bus 14 changes from an "H" level to the middle potential level $V_M$, the input logical threshold is $V_{LH}$ for this case, so that the Schmidt trigger circuit 39 is not triggered and the output state thereof does not change. If the signal level on the output data bus 14 changes from an "L" level to the middle potential level $V_M$, the input logical threshold is $V_{HL}$ for this case, so that the output state of the Schmidt trigger circuit does not change. Thus, data in the state prior to application of potential level $V_M$ is held at an output terminal 16 during the period T. As a result, even if the level on the output data bus 14 is made to be at a middle potential level $V_M$ in response to the middle level control signal 20 immediately before the cross time point of outputs of the sense amplifier 9, signals applied to the output buffer 15 are at the signal level read out in the previous data cycle, so that the output of the output buffer 15 does not change and does not include noise. If the output data bus 14 is released from the middle potential level $V_M$ so that the following data is provided, the level on the output data bus 14 becomes an "H" or "L" level in accordance with read-out data, so that the Schmidt trigger circuit 39 is triggered, the input level thereof is inverted and the inverted level is applied to the output buffer 15. The output buffer 15 transfers to the output terminal 16 signals corresponding to data information provided through the Schmidt trigger circuit 39.

Accordingly, since the output buffer 15 is not affected by the middle potential level $V_M$, the output buffer 15 does not output data information after the output thereof is made to be once at an "L" or "H" level. Thus, the access time does not change and the power consumption does not increase. In addition, output noise is not included in the signals applied to the output terminal 16.

Figure 6:
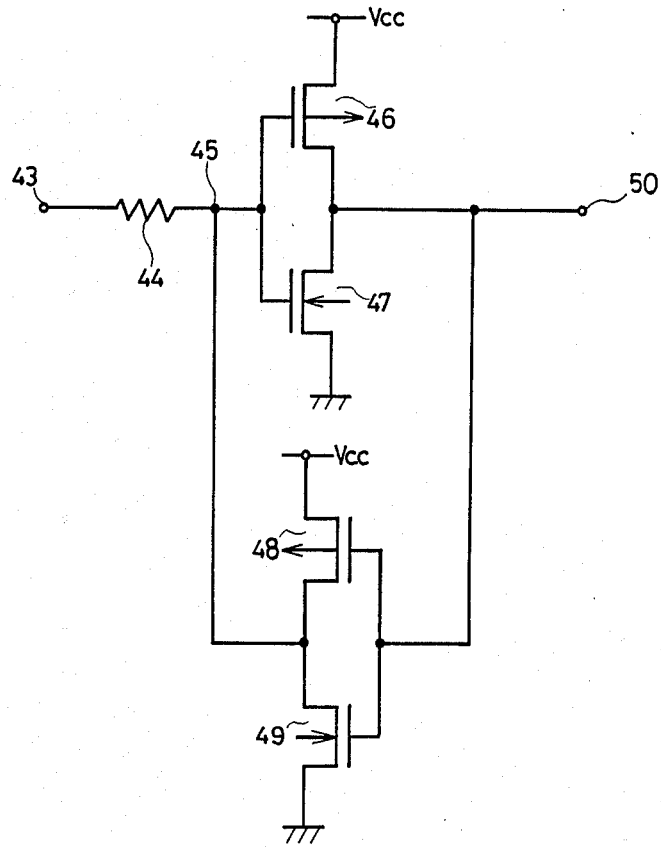
FIG. 6 is a diagram showing an example of a structure of the Schmidt trigger circuit used in the present invention.

FIG. 6 is a diagram showing an example of the structure of the Schmidt trigger circuit 39 used in the semiconductor memory device according to an embodiment of the present invention. In FIG. 6, the Schmidt trigger circuit 39 according to the present invention comprises an input resistor 44, a first inverter and a second inverter. The first inverter comprises a p channel MOS transistor 46 and an n channel MOS transistor 47 which are connected to each other in a complementary manner. More specifically, the p channel MOS transistor 46 has a source connected to a power supply potential $V_{cc}$, a drain connected to a drain of the n channel MOS transistor 47 and an output terminal 50, and a gate connected to one terminal of the input resistor 44 through a node 45. The n channel MOS transistor 47 has a drain connected to the drain of the p channel MOS transistor 46 and the output terminal 50, and a source connected to a ground, and a gate connected to one terminal of the input resistor 44 through the node 45.

The second inverter comprises a p channel MOS transistor 48 and an n channel MOS transistor 49 which are connected to each other in a complementary manner. More specifically, the p channel MOS transistor 48 has a source connected to the power supply potential $V_{cc}$, a drain connected to a drain of the n channel MOS transistor 49 and connected to one terminal of the input resistor 44 through the node 45, and a gate connected to the output portion of the first inverter (that is, a node between the drain of the p channel MOS transistor 46 and the drain of the n channel MOS transistor 47. The n channel MOS transistor 49 has a drain connected to a drain of the p channel MOS transistor 48, a source connected to a ground, and a gate connected to the output portion of the first inverter.

In other words, the input portion of the first inverter is connected to the output portion of the second inverter, and the output portion of the first inverter is connected to the input portion of the second inverter. The other terminal of the input resistor 44 is connected to an input node 43.

Referring to the embodiment shown in FIG. 3, the input node 43 is connected to the output data bus 14, and the output node 50 is connected to the output buffer 15. In input-output voltage characteristics shown in FIG. 4, the input voltage represented by the axis of absissa shows voltage at the input node 43, and the output voltage represented by the axis of ordinate shows voltage of the output node 50. Referring now to FIG. 6, the operation of the Schmidt trigger circuit according to an embodiment of the present invention is described.

The MOS transistors 46 and 47 form the first inverter, and the MOS transistors 48 and 49 form the second inverter. The output of the first inverter is connected to the input of the second inverter and the output of the second inverter is connected to the input of the first inverter, so that a latch circuit is formed. The input resistor 44 is inserted between the node 43 and the node 45. In order to invert the latch state in the Schmidt trigger circuit 39, the potential of the node 45 must exceed the input threshold of the first inverter comprising the MOS transistors 46 and 47. However, the potential of the node 45 has a value obtained by dividing the potential of the input node 43 according to a ratio of the input resistor 44 and the resistance of the conducting MOS transistor (MOS transistor 48 or 49) included in the second inverter.

When the potential in the node 45 is at an "L" level and the potential in the node 50 is at an "H" level, that is, they are in the stable state, the potential in the node 45 must exceed the input logical threshold of the first inverter in order to invert the latch state. The n channel MOS transistor 49 included in the second inverter is in a conductive state and lowers the potential of the node 45. Thus, in order to compensate for that, the potential applied to the node 43 must be higher, by a certain potential, than the input logical threshold of the first inverter.

On the contrary, when the node 45 is at an "H" level and the node 50 is at an "L" level, that is, they are in the stable state, the p channel MOS transistor 48 of the second inverter is in the on-state and pulls up the potential of the node 55. Thus, if the potential of the node 43 is not made lower, by a certain potential, than the input logical threshold of the first inverter, the latch state of the Schmidt trigger circuit 49 is not inverted. The input node 43 is connected to the output data bus 14. Therefore, if the input logical threshold of the first inverter in the Schmidt trigger circuit is coincident with the middle potential level $V_M$ provided to the output data bus 14, the latch state of the Schmidt trigger circuit 39 is not inverted even if the middle potential level $V_M$ is provided to the output data bus 14. The latch state is not inverted until the output data bus 14 is released from the middle potential level and the potential thereof is shifted to a higher or lower level by more than a certain potential. Thus, change in state due to the effect of the middle potential level $V_M$ can be prevented.

Although in the above described embodiment, the Schmidt trigger circuit which inverts logic on the output data bus 14 and outputs the inverted logic has been described, a Schmidt trigger circuit which outputs logic on the output data bus 14 without inversion may be used to obtain the same effect. The resistive element 44 may be formed of polysilicon and may be replaced by the MOS transistor included therein.

Although the first and second inverters have the CMOS structure comprising the complementarily connected MOS transistors, it is not intended to be limited to the structure. For example, only n channel MOS transistors may be used to obtain the same effect.

Although the Schmidt trigger circuit is structured based on a latch circuit comprising two inverters, it may be structured based on any other circuits having the same input-output voltage characteristics to obtain the same effect.

Furthermore, although in the above described embodiment, a middle potential level is applied to the output data bus and the potential of the output data bus is received in the Schmidt trigger circuit, the signal line to which a middle potential level is applied is not intended to be limited to the output data bus. For example, to the other signal line such as an address buffer output bus having large interconnection capacitance the present invention may be applied to obtain the same effect.

Additionally, although a static RAM in which memory cells are divided into a plurality of blocks is described in the above described embodiment, a semiconductor memory device to which the present invention is applied is not intended to be limited to the above kind. The other type of the semiconductor memory device may be used to obtain the same effect.

As described in the foregoing, since the semiconductor memory device according to the present invention in which a middle potential level is provided to a desired signal line for fast operation is adapted such that signals on the signal line with large capacitance are received in a latch circuit having hysteresis characteristics in input-output characteristics, such as a Schmidt trigger circuit, to be transferred to the following signal line, the signal line to the following stages can hold the state in the previous cycle even if the desired signal line is at a middle potential level, whereby signals including no noise can be transferred to an output terminal, so that a semiconductor memory device can be achieved in which the access time does not change and the consumption current does not increase.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells each storing information;
   means for selecting a memory cell out of said plurality of memory cells in response to an externally applied address signal;
   sense amplifier means for amplifying data stored in said selected memory cell;
   output buffer means for providing data amplified by said sense amplifier means to a device external to said memory device;
   a data bus for connecting said sense amplifier means to said output buffer means;
   precharge means responsive to a change in said external address signal for holding said data bus at an intermediate potential level between high and low potential levels for a predetermined period, and
   hysteresis latch means connected between said data bus said output buffer means, said hysteresis latch means having hysteresis in an input/output characteristic thereof and having first and second input switching levels for defining an output level thereof, said first switching level being higher than said intermediate level and lower than said high level, said second switching level being lower than said intermediate level and higher than said low level, wherein hysteresis latch means latches data on said data bus that is sent out in an immediately preceding cycle during the time when said data bus is held at said intermediate level.

2. A semiconductor memory device in accordance with claim 1, wherein said plurality of memory cells are divided into a plurality of blocks, each of said plurality of blocks comprising a sense amplifier responsive to said external address signal for detecting and amplifying information stored in the selected memory cell and a switching circuit for selectively outputting an output of a corresponding one of said sense amplifiers to said data bus responsive to said external address signal.

3. A semiconductor memory device in accordance with claim 1, wherein said hysteresis latch means comprises a Schmidt trigger circuit.

4. A semiconductor memory device in accordance with claim 3, wherein said Schmidt trigger circuit comprises:
   a resistive element having first and second terminals, said first terminal connected to an input terminal of said Schmidt trigger circuit,
   a first inverter having an input terminal connected to the second terminal of said resistive element and an output terminal connected to an output terminal of said Schmidt trigger circuit, and
   a second inverter having an input terminal connected to the output terminal of said first inverter and an output terminal connected to the second terminal of said resistive element and the input terminal of said first inverter.

5. A semiconductor memory device in accordance with claim 4, wherein said first and second inverters each comprises a CMOS inverter in which a p channel field effect transistor and an n channel field effect transistor are connected in series and have commonly connected gates.

6. A semiconductor memory device comprising:
   a data bus;
   a plurality of memory cells for storing information;
   means for selecting a memory cell out of said plurality of memory cells in response to an externally applied address signal;
   said plurality of memory cells being divided into a plurality of blocks, each of said plurality of blocks comprising a sense amplifier responsive to said external address signal for detecting and amplifying information stored in a selected memory cell and a switching circuit for selectively outputting an output of a corresponding one of said sense amplifiers to said data bus responsive to said externally applied address signal;

precharge means responsive to a change in said external address signal for holding said data bus at an intermediate potential level between high and low potential levels for a predetermined period;

output buffer means for outputting data from said selected memory cell; and hysteresis latch means connected between said data bus and said output buffer means, said hysteresis latch means having hysteresis in an input-output characteristic thereof and having first and second input switching levels for defining an output level thereof, said first switching level being higher than said intermediate level and lower than said high level, said second switching level being lower than said intermediate level and higher than said low level, wherein said hysteresis latch means latches data on said data bus that is sent out in an immediately preceding cycle during the time when said data bus is held at said intermediate level.

* * * * *